(12) United States Patent
Schmidt et al.

(10) Patent No.: US 6,255,125 B1
(45) Date of Patent: *Jul. 3, 2001

(54) METHOD AND APPARATUS FOR COMPENSATING FOR CRITICAL DIMENSION VARIATIONS IN THE PRODUCTION OF A SEMICONDUCTOR WAFER

(75) Inventors: Regina T. Schmidt, Milpitas; Christopher A. Spence, Sunnyvale; Anna M. Minvielle; Marina V. Plat, both of San Jose; Khanh B. Nguyen, San Mateo, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/277,093

(22) Filed: Mar. 26, 1999

(51) Int. Cl.$^7$ .................................................... H01L 21/66

(52) U.S. Cl. .................................................................. 438/14

(58) Field of Search ....................... 438/14, 714; 355/77; 430/30

(56) References Cited

U.S. PATENT DOCUMENTS

| | | | | |
|---|---|---|---|---|
| 5,495,122 | * | 2/1996 | Tada | 257/392 |
| 5,627,083 | * | 5/1997 | Tounai | 438/18 |
| 5,994,009 | * | 11/1999 | Tzu et al. | 430/30 |
| 6,033,949 | * | 3/2000 | Baker et al. | 438/232 |
| 6,069,090 | * | 5/2000 | Eriguchi | 438/714 |
| 6,115,108 | * | 9/2000 | Capodieci | 355/77 |

\* cited by examiner

Primary Examiner—John F. Niebling
Assistant Examiner—Olivia T Luk
(74) Attorney, Agent, or Firm—Renner, Otto, Boisselle & Sklar

(57) ABSTRACT

Prior to entering into manufacturing of a final production wafer, a series of test wafers are produced to analyze and test various structures. Each of the test wafers include a substrate, an insulating layer overlying the substrate, and a semi-conductive film layer formed over the insulating layer. The film layer is comprised of, for example, poly-silicon and has a predetermined thickness which substantially corresponds to the thickness of a film layer deposited on the final production wafer. The film layer is etched to form a desired pattern of structures and implanted with a dopant to diffuse dopant atoms thoughout. Thereafter, critical dimension measurements of the structures are taken preferably using electrical line width measurements techniques. Variations in critical dimension measurements taken from the test wafer as compared to desired predetermined line width measurements are compensated for prior to manufacturing the final production wafer so as to provide circuits with the desired electrical parameters.

13 Claims, 3 Drawing Sheets

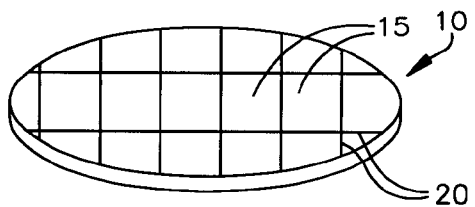
Fig.1a
(PRIOR ART)
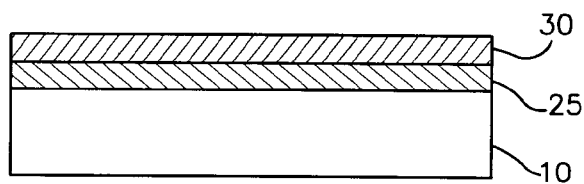
Fig.1b
(PRIOR ART)
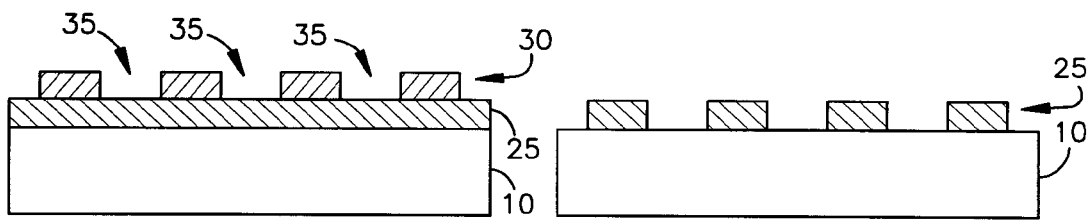
Fig.1c
(PRIOR ART)
Fig.1d
(PRIOR ART)
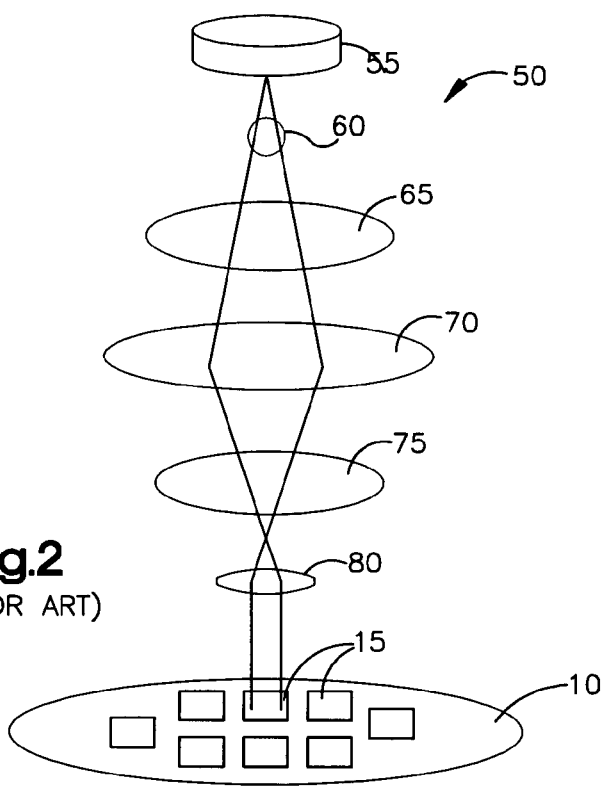
Fig.2
(PRIOR ART)

METHOD AND APPARATUS FOR COMPENSATING FOR CRITICAL DIMENSION VARIATIONS IN THE PRODUCTION OF A SEMICONDUCTOR WAFER

TECHNICAL FIELD

The present invention generally relates to the lithographic patterning of a semiconductor wafer. In particular, the present invention relates to a method and apparatus for forming and measuring structures on a test wafer which allows for more accurate prediction of line width variations which occur during manufacture of a final production wafer.

BACKGROUND OF THE INVENTION

Referring initially to FIG. 1a, integrated circuits are formed on semiconductor wafers 10 typically made from silicon. The wafers 10 are substantially round and typically have a diameter of approximately 15 to 20 cm. Each wafer 10 is divided up into individual circuit die 15 which contain an integrated circuit. Since a single integrated circuit die 15 is often no more than 1 cm$^2$, a great many integrated circuit die 15 can be formed on a single wafer 10. After the wafer 10 has been processed to form a number of integrated circuit die on its surface, the wafer 10 is cut along scribe lines 20 to separate the integrated circuit die for subsequent packaging and use.

Formation of each integrated circuit die on the wafer is accomplished using photo-lithography. In general, lithography refers to processes for pattern transfer between various media. The basic photo-lithography system consists of a light source, a photomask containing the pattern to be transferred to the wafer, a collection of lenses, and a means for aligning existing patterns on the wafer with patterns on the photomask.

Referring to FIG. 1b, during an intermediate stage in the manufacturing cycle, the wafer 10 is shown to include a film 25 which overlies the wafer 10 and a resist 30 disposed on the film 25. Exposing the resist 30 to light or radiation of an appropriate wavelength through the photomask causes modifications in the molecular structure of the resist polymers to allow for transfer of the pattern from the photomask to the resist 30. The modification to the molecular structure allows a resist developer to dissolve and remove the resist in exposed areas, presuming a positive resist is used. If a negative resist is used, the developer removes the resist in the unexposed areas.

Referring to FIG. 1c, once the resist 30 on the wafer has been developed, one or more etching steps take place which ultimately allow for transferring the desired pattern to the wafer 10. For example, in order to etch the film 25 disposed between the resist 30 and the wafer 10, an etchant is applied over the patterned resist 30. The etchant comes into contact with the underlying film layer by passing through openings 35 in the resist formed during the resist exposure and development steps. Thus, the etchant serves to etch away those regions of the film layer which correspond to the openings in the resist, thereby effectively transferring the pattern in the resist to the film layer as illustrated in FIG. 1d. In subsequent steps, the resist is removed and another etchant may be applied over the patterned film layer to transfer the pattern to the wafer or to another layer in a similar manner.

Presently, there are a variety of known techniques for transferring a pattern to a wafer using photolithography. For instance, referring to FIG. 2, a reduction step-and-repeat system 50 (also called a reduction stepper system 50) is depicted. The reduction stepper system 50 uses refractive optics to project a mask image onto a resist layer 30. The reduction stepper system 50 includes a mirror 55, a light source 60, a filter 65, a condenser lens system 70, a mask 75, a reduction lens system 80, and the wafer 10. The mirror 55 behaves as a collecting optics system to direct as much of the light from the light source 60 (e.g. KrF laser, ArF laser, mercury-vapor lamp, etc.) to the wafer 10. The filter 65 is used to limit the light exposure wavelengths to the specified frequencies and bandwidth. The condenser system 70 focuses the radiation through the mask 75 and to the reduction lens system to thereby focus a "masked" radiation exposure onto one of the circuit die 15.

The reduction stepper system 50, projects an image onto a portion of the wafer 10 corresponding to a number of the individual circuit die 15. This image is then stepped and repeated across the wafer 10 in order to transfer the pattern to the entire wafer 10 (and thus the name "stepper"). Current reduction stepper systems 50 utilize masks that contain a pattern that is an enlargement of the desired image on the wafer 10. Consequently, the mask pattern is reduced when projected onto the resist 30 during exposure (and thus the name "reduction stepper").

With an ever increasing number of integrated circuit patterns being formed on a circuit die, the importance of properly designing patterns to form structures that are isolated and non-interfering with one another has also increased. Accordingly, when designing a pattern to place on a mask, it is of significant benefit to know in advance the amount of error to expect with respect to the corresponding structures formed on the wafer so that such error can be accounted for in advance. For example, devices such as a microprocessor formed on the semiconductor wafer often will be limited by the transistor providing the slowest speed. As the speed of a transistor can vary significantly as a result of line width variations, it is desirable to know in advance how the transistors formed at various locations in the stepper field will be affected by various processing steps so that such variations can be properly accounted for.

Prior to manufacturing of a final production wafer, a series of test wafers are produced to analyze and test various circuit components. While it is possible to estimate line width variations on the structures formed on the test wafer in order to predict the amount of line width variations to expect of corresponding structures formed on the final production wafer, such estimates have often shown to deviate from the actual line width variations which occur. Thus, if inaccurate line width corrections are made based on such estimates, this in turn can lead to slower device processing speeds as compared to a device produced in which all line width variations are properly compensated for in advance.

Accordingly, there is a strong need in the art for a method of accurately predicting what effect the various processing steps will have on line width variations of structures formed throughout an imaging field.

SUMMARY OF THE INVENTION

Prior to entering into manufacturing of a final production wafer, a series of test wafers are produced to analyze and test various circuits. Each test wafer includes a substrate, an insulating layer overlying the substrate, and a semi-conductive film layer formed over the insulating layer. The film layer is comprised of, for example, poly-silicon and has a predetermined thickness which substantially corresponds to the thickness of a film layer deposited on the final production wafer.

An anti-reflective coating is formed over the film layer and a photo-resist is formed over the anti-reflective coating. The anti-reflective coating and photo-resist are used to etch a desired pattern in the film layer. Once etched, the film layer is implanted with a dopant to diffuse dopant atoms throughout. Thereafter, line width measurements of the etched pattern are taken using conventional electrical line width measurement techniques or the like. Variations found in the line width measurements from desired line width measurements are then compensated for prior to manufacturing the final production wafer so as to provide circuits with faster processing speeds. For example, line width variations found with respect to certain structures on the test wafer may be compensated for by varying the design of the pattern formed on the reticle prior manufacture of the final production wafer.

By using a semi-conductive film layer and implanting the film layer with a conductive dopant only after etching, the test wafers of the present invention are produced in a manner which closely follows the process used to produce a final production wafer. Accordingly, line width measurements taken from the test wafers of the present invention provide more accurate data related to actual line width variations which will occur during manufacturing of the final production wafers. Thus, such line width variations can be accounted for prior to mass production of the final production wafers.

By comparison, conventional test wafers are produced using a conductive film layer. Because such conventional test wafers use a conductive film layer as opposed to an un-doped semi-conductive film layer as in the present invention, the thickness of the film layer used in conventional test wafers is not the same as that used during production of a final production wafer. Additionally, since the film layer of a conventional test wafer is conductive, such film layer is not doped with dopant atoms as is done during manufacture of a final production wafer. Further, the enchants used to etch a pattern into the conducive film layer on the conventional test wafer are often different than that used to etch a corresponding pattern into the semi-conductive film layer used on a final production wafer. Accordingly, line width measurements taken from a conventional test wafer may differ significantly from the actual line width measurements occurring during manufacture of the final production wafer since the process and layers used to produce conventional test wafers differ greatly from the process used to produce the final production wafers. The test wafers of the present invention, however, use virtually the same process and materials as that used during manufacture of the final production wafer and therefore provide accurate data regarding expected line width variations which may occur.

According to one aspect of the present invention, a method of manufacturing a final production wafer is provided. The method includes the steps of providing a test wafer having a semi-conductive film formed thereon, etching the film to form a pattern defining a plurality of structures, implanting the film with a dopant so as to cause the film to be conductive, measuring a critical dimension of at least one of the plurality of structures, determining variations between the at least one measured critical dimensions and a respective predetermined desired critical dimension, and substantially compensating for at least one of the variations in the manufacturing of the final production wafer.

In accordance with another aspect of the present invention, a method of manufacturing a test wafer is provided. The method includes the steps of forming a semi-conductive film layer over a substrate, patterning the film layer, and implanting the film layer with a dopant so as to cause the patterned film layer to be conductive.

In accordance with yet another aspect of the present invention, a test wafer is provided. The test wafer includes a substrate, an insulating film layer formed over the substrate, and a semi-conductive film layer formed over the insulating film layer, the semi-conductive film layer serving as a layer in which electrical circuits for testing will be formed.

To the accomplishment of the foregoing and related ends, the invention then, comprises the features hereinafter fully described and particularly pointed out in the claims. The following description and the annexed drawings set fourth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

BRIEF DESCRIPTION OF THE DRAWINGS

In the annexed drawings:

FIG. 1a is a diagrammatic view of a prior art semiconductor wafer having a circuit die formed thereon;

FIG. 1b is a partial cross section illustrating a prior art semiconductor wafer having a film overlying the wafer which in turn is covered by a photoresist layer;

FIG. 1c is a partial cross section illustrating the photoresist layer of FIG. 1b after being developed;

FIG. 1d is a partial cross section illustrating the film layer of FIG. 1c after being etched;

FIG. 2 is a system view of a prior art reduction stepper wherein refractive optics are used to transfer a pattern to a circuit die on a wafer;

DETAILED DESCRIPTION OF THE INVENTION

The present invention will now be described with respect to the accompanying drawings in which like numbered elements represent like parts.

According to the present invention, it is possible to accurately predict critical dimension variations which occur among structures formed on a final production wafer. By predicting in advance the expected critical dimension variations, such variations can be accounted for prior to manufacturing the final production wafer. Critical dimension variations such as line width variations are more accurately predicted using a film stack and process of producing test wafers which closely follows the film stack and process used in manufacturing the final production wafer. Once such critical dimension variations are predicted, modifications to the manufacturing tools, steps, materials, etc. of the final production wafer can be made to compensate for the expected variations. For example, if the line width of a particular structure was found to be narrow on a test wafer, the corresponding reticle pattern producing the structure may be modified to compensate for the expected variations in advance of producing the final production wafer. Accordingly, each of the structures formed on the final production wafer is optimized to the desired critical dimensions to provide the fast and reliable electrical signal processing.

Figure 3:
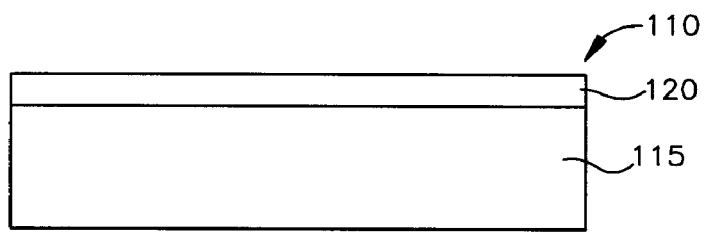
FIG. 3 is a partial cross section illustrating a test wafer during a step in its manufacturing cycle in which an insulating film is formed over a substrate in accordance with the present invention.

Referring initially to FIG. 3, a test wafer 110 is depicted at an early stage in its manufacturing cycle. The test wafer 110 is produced to test and analyze circuits which will ultimately be formed on a final production wafer but is not itself intended for use with a final product. The test wafer 110 includes a substrate 115 having an oxide layer 120 deposited thereon. The substrate 115 in the present invention is composed of silicon although other suitable substrate materials could alternatively be used. The oxide layer 120 is formed over the substrate and serves as an insulating layer as is known in the art.

Figure 4:
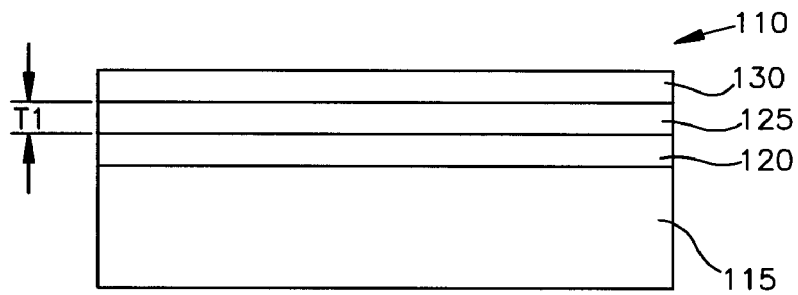
FIG. 4 is a partial cross section illustrating the test wafer following deposition of a semi-conductive film layer and bottom anti-reflective coating over the insulating film in accordance with the present invention.

Referring next to FIG. 4, a subsequent step in the manufacturing cycle of the test wafer 110 is shown in which both a semi-conductive film layer 125 and a bottom anti-reflective coating 130 (BARC 130) are formed over the oxide layer 120 in the same manufacturing step. In the present embodiment, the semi-conductive film layer 125 is an un-doped poly-silicon layer. However, it will be appreciated that other semi-conductive or non-conductive film materials which correspond to the film layer used to produce the final production wafer may alternatively be used. Depending on the critical dimension width of the structures to be formed in the film layer 125, the thickness T1 of the film layer 125 will vary. For example, for structures in the 0.25 micron generation, the film layer 125 has a thickness T1 of approximately 2000 Å while for structures formed in the 0.18 micron generation, the thickness T1 is approximately 1700 Å. Of course, the thickness T1 of the film layer 125 may be varied to other suitable thicknesses which, for example, closely follow the thickness of the corresponding film layer used to produce the final production wafer. As will be discussed in more detail below, by utilizing an un-doped, semi-conductive polysilicon layer as opposed to a conventional conductive film layer on the test wafer 110, the present invention is able to more accurately predict the critical dimension variations which occur during the production of the final production wafers.

Figure 5:
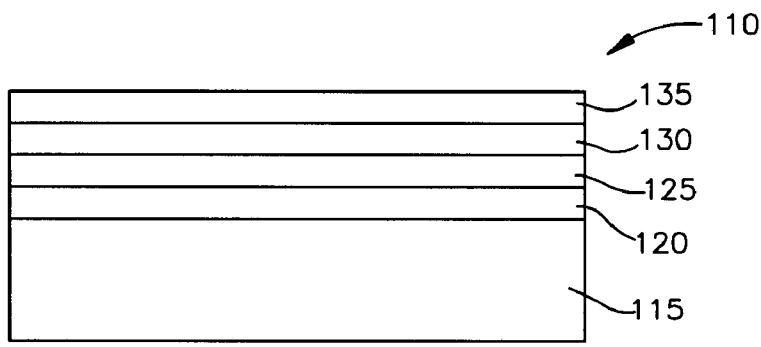
FIG. 5 is a partial cross section illustrating the test wafer following formation of a photoresist over the bottom anti-reflective coating in accordance with the present invention.

Referring now to FIG. 5, the test wafer 110 is shown to have deposited thereon a photoresist 135. The photoresist 135 serves to photolithographically receive a pattern from a reticle (not shown) or other mask through exposure of the photoresist to patterned light and/or radiation. In the present embodiment the photoresist is exposed to light in the deep-UV range although other exposure wavelengths could alternatively be used. During the photolithographic pattern transfer process, the BARC 130 underlying the photoresist 125 serves to reduce non-uniformly distributed reflected light from negatively affecting the pattern transfer process. In the present embodiment the BARC 130 is made of SiON although other anti-reflective coating materials could alternatively be used. The thickness and index of refraction of the BARC 130 are tuned to give minimum reflectivity at the exposure wavelength as is known in the art.

Figure 6:
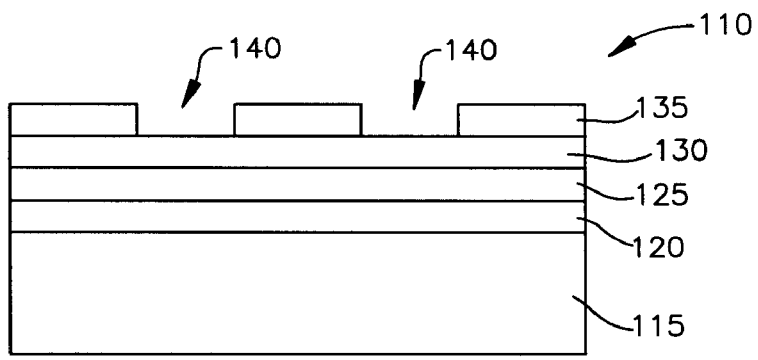
FIG. 6 is a partial cross section illustrating the test wafer following photoresist exposure and development in accordance with the present invention.

Referring next to FIG. 6, the test wafer 110 is depicted following resist exposure and development. As shown, developed regions 140 are formed in the photoresist 135 corresponding to the regions of the photoresist 135 which were exposed to light or other radiation in the previous exposure step. The developed regions 140 are formed, for example, by application of a developer solution (not shown) to the photoresist which removes the regions of the photoresist which were exposed to the light.

Figure 7:
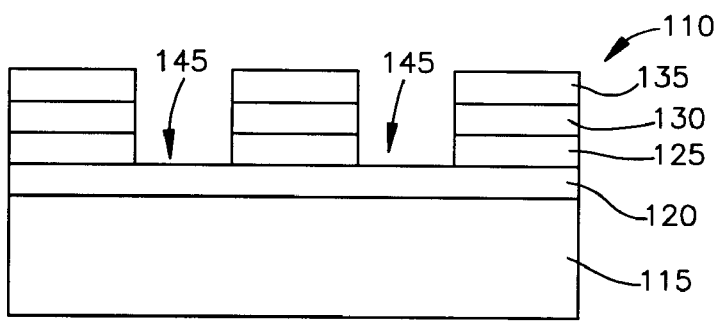
FIG. 7 is a partial cross section illustrating the test wafer following etching of the bottom anti-reflective coating and the semi-conductive film layer in accordance with the present invention.

As shown in FIG. 7, following photoresist development, an etching step takes place whereby the BARC 30 and film layer 125 are etched so as to transfer the pattern from the photoresist 135 to the film layer 125. In order to etch the film layer 125, an etchant is applied over the photoresist 135. In the present embodiment, the etchant is a dry etchant suitable for etching the un-doped polysilicon film layer 125. However, suitable wet etchants could alternatively be used. The etchant serves to substantially remove those regions of both the BARC 30 and film layer 125 beneath the developed regions 140 of the photoresist 135 thereby forming etched regions 145.

Figure 8:
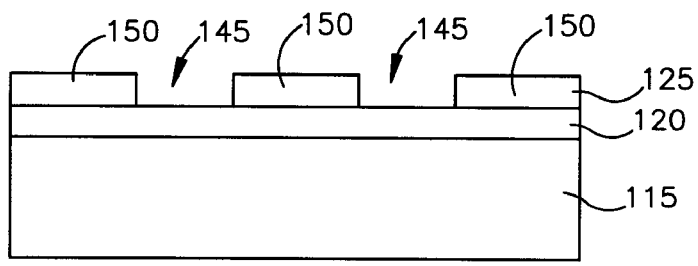
FIG. 8 is a partial cross section illustrating the test wafer following removal of the photoresist and bottom anti-reflective coating in accordance with the present invention.
Figure 9:
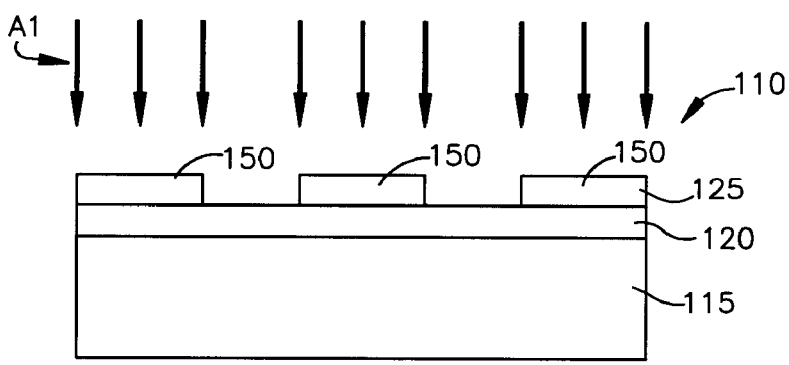
FIG. 9 is a partial cross section illustrating the semi-conductive film layer of the test wafer being implanted with a dopant in accordance with the present invention.

Referring now to FIG. 8, the test wafer 110 is shown following removal of both the photoresist 135 and BARC 130. At this stage in the manufacturing cycle, the un-doped film layer 125 includes a plurality of structures 150 formed therein which correspond to the pattern transferred from the photoresist layer 135. In order to allow the structures 150 to be used to process electrical signals, the film layer 125 is doped with a dopant as shown by arrows AI in FIG. 9. More particularly, the un-doped polysilicon of the film layer 125 is implanted with a dopant such as arsenic which allows for dopant atoms to diffuse into the film layer 125. It will be appreciated that any suitable dopant as is conventionally known in the art may be used. Further, although the present embodiment depicts the film layer 125 being doped following etching thereof, it will be appreciated that the film layer 125 could alternatively have been implanted with a dopant prior to etching.

Figure 10:
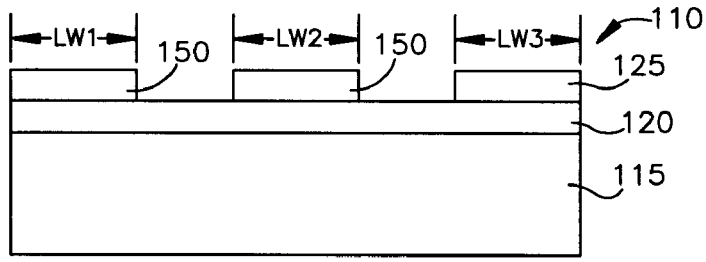
FIG. 10 is a partial cross section illustrating the measurement of critical dimensions of structures formed in the film layer in accordance with the present invention.

Referring now to FIG. 10, following transformation of the film layer 125 into a conductive film layer, line width measurements of the structures 150 formed in the film layer 125 are taken in order to predict critical dimension variations which will occur during manufacture of the final production wafers. According to the present embodiment, the line width measurements such as LW1, LW2, and LW3 are taken using conventional electrical line width measurement (ELM) techniques wherein the resistivity of structures are electrically measured to determine the corresponding line width for the structure.

Since the test wafer 110 of the present invention is produced in a manner which closely follows the production of final production wafer, the line width measurements taken from the test wafer are more accurate and reliably predictive of the line widths to be expected for corresponding structures formed on the final production wafer. For example, unlike conventional test wafers, the test wafer of the present embodiment utilized a semi-conductive polysilicon film layer during formation of the circuit structures thereon. The thickness of the film layer 125 more closely matches the actual thickness of the film layer used in producing the final production wafer. Since critical dimensions can vary depending on variations in thickness of film layers, the present invention provides more accurate critical dimension prediction capabilities over conventional test wafers where the thickness of the conductive film layer is not closely matched to the thickness of the corresponding semi-conductive film layer used in the final production wafer. Also, as briefly mentioned above, since the present invention uses a semi-conductive film layer 125, the etchant applied to the film layer 125 to form the etched regions can be the same etchant as used to form the final production wafer. By comparison, in conventional test wafers, different enchants are used in etching the conductive film layer on the test wafers than is used to etch the semi-conductive film layer on the final production wafer. Such variations in etchants can also lead to less reliable predictions of the critical dimensions to expect from production of the final production wafer.

Figure 11:
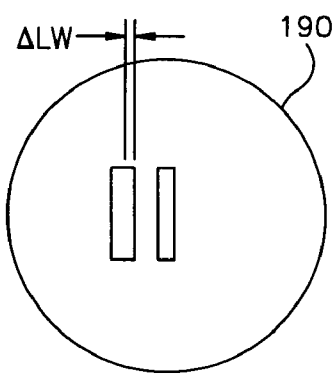
FIG. 11 is a diagrammatic view of a pattern formed on a reticle used in manufacturing a final production wafer illustrating how variations in critical dimensions determined from measurements taken from the test wafer can be compensated for in the production of the final production wafer.

Once critical dimension measurements are taken, the next step is to compare the critical dimension measurements with a predetermined desired critical dimension measurement for each of the structures being tested. If variations are found, then such variations are preferably accounted for prior to manufacturing the final production wafers. In particular, compensations of variations in critical dimension measurements can be accomplished through any of a variety of known techniques. For example, referring to FIG. 11, it may be determined from the electrical line width measurement of a structure formed on the test wafer 10 that a critical dimension of the structure has been reduced by an amount of ΔLW. To compensate for this variation, the corresponding feature on a reticle 190 may be patterned to have an additional amount of material ΔLW added thereto. In this way, the structure formed on the final production wafer will be of the desired critical dimension. Other ways of compensating for difference found in critical dimension measurements include varying the degree to which phase shift masking is applied to a reticle used in manufacturing the final production wafer, modifying the design or location in which structures are formed on the wafer, modifying the tools or lens used during manufacturing etc.

In addition to using the test wafer 110 to predict critical dimension variations, the test wafer can also be used to calibrate a variety of other equipment or processes prior to manufacturing the final production wafer. For example, the test wafer can be used to characterize aberrations of a lens, characterize stepper field non-uniformities, characterize effects of phase shift mask techniques and optical proximity correction, and optimize stepper setting conditions like numerical aperture, partial coherence, and both conventional and off-axis illumination characterization, using known techniques in the art.

The invention has been described with reference to the preferred embodiments. Obviously, modifications and alterations will occur to others upon reading and understanding the preceding detailed description. It is intended that the invention be construed as including all such modifications alterations, and equivalents thereof and is limited only by the scope of the following claims.

What is claimed is:

1. A method of manufacturing a final production wafer, comprising the steps of:

providing a test wafer having an un-doped semi-conductive film formed thereon;

etching the film to form a pattern defining a plurality of structures;

implanting the film with a dopant so as to cause the film to be conductive;

measuring a critical dimension of at least one of the plurality of structures;

determining variations between the at least one measured critical dimensions and a respective predetermined desired critical dimension; and substantially compensating for at least one of the variations in the manufacturing of the final production wafer.

2. The method of claim 1, wherein the un-doped film is an un-doped polysilicon film.

3. The method of claim 2, wherein the film is approximately 2000 Å or less in thickness.

4. The method of claim 3, wherein the dopant is arsenic.

5. The method of claim 1, wherein prior to the step of implanting, the test wafer further includes an anti-reflective coating overlying the film and a photoresist overlying the anti-reflective coating and the step of etching includes the steps of:

transferring a pattern to the photoresist using photolithography;

developing the photoresist; and applying an etchant over the photoresist which is suitable for etching the film.

6. The method of claim 1, wherein the step of measuring the critical dimension is by way of using electrical line width measurement techniques.

7. A method of manufacturing a test wafer comprising the steps of:

forming an un-doped semi-conductive film layer over a substrate;

patterning the film layer to form a pattern defining a plurality of structures;

implanting the film layer with a dopant so as to cause the film layer to be conductive;

measuring a critical dimension of at least one of the plurality of structures; and determining variations between the at least one measured critical dimensions and a respective predetermined desired critical dimension.

8. The method of claim 7, wherein the un-doped film layer is an un-doped polysilicon film.

9. The method of claim 8, wherein the dopant is phosphorous.

10. The method of claim 8, wherein the non-conductive film layer is approximately 2000 Å or less in thickness.

11. The method of claim 7, wherein an insulating layer is formed between the substrate and the non-conductive film.

12. The method of claim 11, wherein the insulating layer is an oxide.

13. The method of claim 7, wherein the step of patterning the film layer includes the step of etching the film layer with an etchant.

* * * * *